United States Patent [19]

Blalock et al.

[11] Patent Number: 5,286,344
[45] Date of Patent: Feb. 15, 1994

[54] PROCESS FOR SELECTIVELY ETCHING A LAYER OF SILICON DIOXIDE ON AN UNDERLYING STOP LAYER OF SILICON NITRIDE

[75] Inventors: Guy Blalock; David S. Becker; Fred Roe, all of Boise, Id.

[73] Assignee: Micron Technology, Inc., Boise, Id.

[21] Appl. No.: 898,505

[22] Filed: Jun. 15, 1992

[51] Int. Cl.$^5$ ............................................. H01L 21/00
[52] U.S. Cl. .................................... 156/657; 156/643; 156/646; 156/662; 156/656; 156/659.1
[58] Field of Search ............ 156/643, 646, 662, 659.1, 156/652, 653, 657, 655, 654

[56] References Cited

U.S. PATENT DOCUMENTS

| | | | |
|---|---|---|---|
| 3,479,237 | 11/1969 | Berg | 156/11 |
| 4,180,432 | 12/1979 | Clark | 156/643 |
| 4,244,752 | 1/1981 | Henderson et al. | 148/1.5 |
| 4,324,611 | 4/1982 | Vogel et al. | 156/643 |
| 4,374,698 | 2/1983 | Sanders et al. | 156/643 |
| 4,568,410 | 2/1986 | Thornquist | 156/643 |
| 4,581,101 | 4/1986 | Senoue et al. | 156/643 |
| 4,734,152 | 3/1988 | Geis et al. | 156/657 |
| 4,734,157 | 3/1988 | Carbaugh et al. | 156/643 |
| 4,789,560 | 12/1988 | Yen | 427/96 |
| 4,877,641 | 10/1989 | Dory | 427/38 |
| 4,912,061 | 3/1990 | Nasr | 437/44 |
| 4,971,655 | 11/1990 | Stefano et al. | 156/659.1 |
| 4,978,420 | 12/1990 | Bach | 156/643 |
| 5,013,398 | 5/1991 | Long et al. | 156/643 |
| 5,013,692 | 5/1991 | Ide et al. | 437/241 |
| 5,040,046 | 8/1991 | Chhabra et al. | 357/54 |
| 5,043,790 | 8/1991 | Butler | 357/68 |

OTHER PUBLICATIONS

"A Method of Obtaining High Oxide to Nitride Selectivity in an Menle Reactor," by Becker, Blalock to be presented at the spring Electrochemical Society Meeting, May 1993.

"Selective Oxide: Nitride Dry Etching in a High Density Plasma Reactor" by M. Armocost, J. Marks, May 1993.

"Crown-Shaped Stacked-Capacitor Cell for 1.5-V Operation 64-Mb Drams", Kaga et al., 1991 IEEE.

"VLSI Devoced Fabricator Using Unique, Highly-selective Si$_3$N$_4$ Dry Etching" (T. Kur et al.), Proceeding of the International Electron Devices Meeting (IEDM), 1983, pp. 757-759.

"Formation of Contracts in a Planarized SiO2/Si3N4-/SiO2 Dielectric Structure" (Paul E. Riley, Konrad K. Young, and Charles C. Liu) J. Electrochem. Soc., vol. 139, No. 9, Sep. 1992.

"Self-Aligned Betline Contact for 4 MBit Dram", K. H. Kuesters, H. M. Mueklhoff, G. Enders, E. G. Mohr, W. Mueller, pp. 640-649, 1987.

"A Buried-Plate Trench Cell for a 64-Mb Dram", Kenney et al., 1992 Symposium of VLSI, IEEE.

Primary Examiner—Brian E. Hearn
Assistant Examiner—George Goudreau
Attorney, Agent, or Firm—Michael W. Starkweather

[57] ABSTRACT

More specifically, a process is provided for etching a multilayer structure to form a predetermined etched pattern therein. The subject process comprises providing the multilayer structure having a plurality of structural layers. The structural layers of the multilayer structure comprise a silicon dioxide outer layer on an underlying silicon nitride stop layer. Then, a chemical etchant protective layer is formed on a major surface of the multilayer structure having a predetermined pattern of openings, thereby exposing areas of the silicon dioxide outer layer corresponding to the predetermined pattern of openings. The exposed areas of the silicon dioxide outer layer are then etched down to the silicon nitride stop layer, at a high SiO$_2$ etch rate and at a high level of selectivity of the SiO$_2$ etch rate with respect to the Si$_3$N$_4$ etch rate, with a fluorinated chemical etchant system. The fluorinated chemical etchant system includes an etchant material and an additive material. The additive material comprises a fluorocarbon material in which the number of hydrogen atoms is equal to or greater than the number of fluorine atoms. The etching step forms a substantially predetermined etch pattern in the silicon dioxide outer layer in which the contact sidewalls of said SiO$_2$ outer layer are substantially upright.

31 Claims, 1 Drawing Sheet

PROCESS FOR SELECTIVELY ETCHING A LAYER OF SILICON DIOXIDE ON AN UNDERLYING STOP LAYER OF SILICON NITRIDE

BACKGROUND OF THE INVENTION

This invention relates to a process for selectively etching a silicon dioxide layer deposited on a silicon nitride layer, and more particularly to a process for effectively and efficiently etching such silicon dioxide layer at a high etch rate and high selectivity of silicon dioxide with respect to silicon nitride, particularly in a multilayer structure.

It is known in the prior art that the manufacture of multilayer multilayer structures typically involves patterned etching of areas of the semiconductor surface which are not covered by a pattern of photoresist protective material. These etching techniques use liquid or wet etching materials, or dry etching with halogens or halogen-containing compounds, of certain layers of these devices. For example, one well known etching material is chlorine which can exist in the etching process as either chlorine gas or HCl, etc. Chlorine etches the semiconductor isotropically, i.e., in both a lateral and vertical direction. This results in an etched feature which has a line width which is smaller than the exposed resist image.

Etching of the multilayer structures can also be conducted in a gas phase using known techniques such as plasma etching, ion beam etching, and reactive ion etching. The use of gas plasma technology provides substantially anisotropic etching using gaseous ions, typically generated by an RF discharge. In gas plasma etching the requisite portion of the surface to be etched is removed by a chemical reaction between the gaseous ions and the subject surface. In the anisotropic process, etching takes place only or primarily in the vertical direction so that feature widths substantially match the photoresist pattern widths. Anisotropic etching is utilized when feature sizing after etching must be maintained within specific limits in order not to violate alignment tolerances or design rules. For example, in U.S. Pat. No. 4,734,157 an elemental silicon-containing layer, such as a layer of polysilicon or silicide, is etched anisotropically employing a gas plasma comprising a gaseous chlorofluorocarbon, capable of supplying $CF_x$ and chlorine ions, and ammonia. Profile control of a silicon layer is controlled by the use of this etching mode.

Higher density multilayer structures such as 64 and 256 Megabit DRAM will require an additional amount of alignment tolerance which can not be addressed by photolithography means. In such applications, an etch stop technology could be used to supply the desired tolerance. In an etch stop system an etch stop layer is deposited on underlying structures. The outer layer is deposited over the underlying etch stop layer through which the desired patterns will be defined. The etch stop layer will then be used to terminate the etch process once the outer layer has been completely removed in the desired pattern locations. Thus the etch stop layer acts to protected structures underlying the etch stop layer from damage due to the outer layer dry chemical etch. The process used to perform this etch must have three basic properties, namely, (1) a high outer layer etch rate which (2) produces substantially upright sidewalls and (3) has a high selectivity of the outer layer being etched down to the etch stop layer. The preferred etch stop material is silicon nitride because it's properties are well known and it is currently used for semiconductor fabrication. The preferred outer layer is silicon dioxide.

With respect to etching of a multilayer structure including a silicon dioxide layer on an underlying silicon nitride layer, a problem which occurs and which must be overcome is profile control. Prior art methods of obtaining high oxide to nitride selectivity rely on pure chemical etching (such as hydrofluoric acid). Profile control using this method produced structures that do not have vertical sidewalls. Dry etch processing usually produces a more vertical profile because of the ion bombardment aspect of the process. However, the dry etch process can produce a contact wall that slopes out from the bottom instead of being 90 if the wrong mix of process parameters are used. These parameters can include, but are not limited to, $CF_4$, $CHF_3$, RF Power, and pressure.

The same ion bombardment aspect of the dry etch process used to produce straight sidewalls has a very negative effect on oxide to nitride selectivity. High energy ions needed to etch both oxide and nitride do so by disassociating a chemical bond at the oxide and/or nitride surface. However the disassociation energy needed for nitride is less than that required for oxide. Hence the addition of $CH_2F_2$ to offset the disassociation properties of nitride as compared to oxide. The $CH_2F_2$ produces a polymer deposition on the nitride surface that acts to passivate the nitride surface and thereby reduce the dry etch removal rate. However, the silicon dioxide etch rate is sustained at a much higher rate than that of silicon nitride.

Here is a discussion of various prior art processes for etching silicon dioxide and/or silicon nitride. In U.S. Pat. No. 4,789,560 to Yen, for example, a fusion stop method is provided for forming silicon oxide during the fabrication of integrated circuit devices. A diffusion stop layer of thermal silicon oxide is formed during the fabrication of integrated circuit device prior to the deposition of the poly layer to be oxidized. The nitride isolates the substrate from diffused oxygen within the poly layer during oxidation, permitting a non-critical oxidation time.

U.S. Pat. No. 4,877,641 to Dory discloses a plasma CVD for forming silicon nitride or silicon dioxide films onto a substrate using a reactant gas including di-tert butylsilane and at least one other reactant gas.

U.S. Pat. No. 4,324,611 to Vogel et al. discloses a process and gas mixture for etching silicon dioxide and/or silicon nitride in a plasma environment in a planar reactor using a carbon fluorine gas comprising $C_2F_6$, $CF_4$, $C_3F_8$, $C_4F_{10}$, $C_4F_8$, and combinations thereof.

U.S. Pat. No. 4,912,061 to Nasr discloses a method of forming a salicided self-aligned metal oxide multilayer structure using a disposable silicon nitride spacer.

U.S. Pat. No. 4,568,410 to Thornquist relates to the selective gaseous plasma etching with nitrogen fluoride and an oxygen source gas of silicon nitride in the presence of silicon oxide.

U.S. Pat. No. 3,479,237 to Bergh et al. discloses etching silicon oxide on silicon nitride using a hydrofluoric acid solution.

U.S. Pat. No. 4,971,655 to Stefano et al. discloses a method for protecting a refractory metal silicide during high-temperature processing using a dual-layer cap of silicon nitride on silicon dioxide.

U.S. Pat. No. 5,013,398 to Long et al. discloses a plasma etch process to anisotropically etch a sandwich structure of silicon dioxide, polycrystalline silicon and silicon dioxide "in situ", that is, in a single etch chamber.

U.S. Pat. No. 5,040,046 to Chhabra et al. discloses a process for forming silicon dioxide, or silicon nitride layers on selected substrates employing $C_4H_{12}Si$ and an $O_2$ source.

U.S. Pat. No. 5,013,692 to Ide et al. discloses a process for preparing film for a semiconductor memory device which comprises forming a silicon nitride film over a substrate by a chemical vapor deposition technique, oxidizing the surface of the silicon nitride film to form a silicon oxide layer over the film, and removing the silicon oxide layer by etching to form an improved silicon nitride film.

U.S. Pat. No. 4,244,752 to Henderson, Sr. et al. discloses a method of fabricating an integrated circuit wherein a silicon oxide-silicon nitride layer is formed on the surface of a silicon wafer.

U.S. Pat. No. 4,374,698 to Sanders, et al. relates to the etching of $SiO_2$ or $Si_3N_4$ with $CF_4$, $CF_2Cl_2$ or $CF_3Br$, and $O_2$, while U.S. Pat. No. 4,581,101 to Senoue et al. etches the same materials with a fluorinated ether.

U.S. Pat. No. 5,043,790 to Butler uses upper and lower nitride layers in the formation of sealed self-aligned contacts. The upper non-conductive nitride layer is composed of silicon nitride which acts as an etch stop layer for an isotropic silicon dioxide wet etch. The lower nitride layer is a titanium nitride layer on a titanium silicide layer, both of which are conductive materials. The titanium nitride layer acts as an etch stop during an anisotropic dry etch of the silicon dioxide layer.

Current etch process technology for etching an $SiO_2$ outer layer on an underlying $Si_3N_4$ layer using a dry etcher, such as an RIE or MRIE etcher, cannot produce $SiO_2$-to-$Si_3N_4$ selectivities above 3:1 with adequate profile and $SiO_2$ etch rate characteristics. Therefore, a need exists for a process for etching a $SiO_2$ layer on an underlying $Si_3N_4$ layer, at a high $SiO_2$ etch rate, and at a high selectivity of $SiO_2$ with respect to the underlying $Si_3N_4$, to form an etched multilayer structure at a controlled predetermined profile in which the sidewalls are substantially upright.

SUMMARY OF THE INVENTION

The process of the present invention meets the above-described existing needs by forming the above-described etched multilayer structure in which the sidewalls of the $SiO_2$ layer are substantially upright at a high $SiO_2$ etch rate and at a high selectivity of $SiO_2$ with respect to the underlying $Si_3N_4$. This is accomplished by employing a process for etching the $SiO_2$ layer down to the $Si_3N_4$ stop layer as hereinafter described.

In two published articles "Crown-Shaped Capacitor Cell for 1.5 V Operation 64 Mb DRAMS" by T. Kaga, et al in *IEEE Transactions On Electron Devices*, Vol. 38, No. 2, February 1991, and "VSLI Device Fabricator Using Unique, Highly Selective $Si_3N_4$ Dry Etching" by T. Kure, et al Proceeding of the International Electron Devices Meeting (IEDM), 1983, pp. 757-759., a highly selective anisotropic dry etching technique is described for etching a $Si_3N_4$ layer down to an underlying $SiO_2$ stop layer using a $CH_2F_2$ plasma. However, applicants have unexpectedly discovered that when $CH_2F_2$ is employed as an additive in a fluorinated chemical etchant system, substantially high oxide to nitride selectivities can be achieved, with high etch rate, and substantially upright sidewall profiles.

More specifically, a process is provided for etching a multilayer structure to form a predetermined etched pattern therein. The subject process comprises providing the multilayer structure having a plurality of structural layers. The structural layers of the multilayer structure comprise a silicon dioxide outer layer on an underlying silicon nitride stop layer. Then, a chemical etchant protective layer is formed on a major surface of the multilayer structure having a predetermined pattern of openings, thereby exposing areas of the silicon dioxide outer layer corresponding to the predetermined pattern of openings. The exposed areas of the silicon dioxide outer layer are then etched down to the silicon nitride stop layer, at a high $SiO_2$ etch rate, and at a high level of selectivity of the $SiO_2$ etch rate with respect to the $Si_3N_4$ etch rate, with a fluorinated chemical etchant system. The etching step forms a substantially predetermined etch pattern in the silicon dioxide layer in which the contact sidewalls of said $SiO_2$ are substantially upright.

The fluorinated chemical etchant system includes an etchant material and an additive material. The additive material comprises a fluorocarbon material in which the number of hydrogen atoms is equal to or greater than the number of fluorine atoms. Fluorocarbon materials comprise carbon, hydrogen and fluorine atoms in differing relative ratios. For example, the preferred fluorocarbon material employed as the additive material is $CH_2F_2$. In case of $CH_2F_2$, the number of hydrogen atoms (2) is equal to the number of fluorine atoms (2). Another fluorocarbon material which can be used as the additive material in the present invention is $CH_2F_2$. As to $CH_3F$, the number of hydrogen atoms (3) is greater than the number of fluorine atoms (1).

In the process of this invention the fluorinated chemical etchant system preferably comprises from about 70-90%, and more preferably from about 75-85%, of the etchant material, and from about 10-30%, and more preferably from about 15-25% of the additive material, based on the total flow of the fluorinated chemical etchant system. The amount of the additive material, $CH_2F_2$, based on the total flow of fluorinated chemical etchant system, is preferably at least about 3%, more preferably at least about 12%, and most preferably at least about 20%. Preferably, the etchant material of the fluorinated chemical etchant system of this invention comprises at least one of $CHF_3$, $CF_4$ and Ar. In the preferred $CHF_3$-Ar-$CF_4$ system, the amount of $CHF_3$ in the gas flow mixture is preferably about 3%, more preferably about 6%, and most preferably at least about 10% of the total gas flow. With respect to argon, the flow rate should be at least about 33%, more preferably at least about 50%, and most preferably at least about 60% of the total gas flow. Finally, as to the flow rate of $CF_4$, it should preferably be at least about 10%, more preferably at least about 16%, and most preferably at least about 22% of the total gas flow.

The total pressure of this etching process preferably ranges from 0.001-0.5 torr, more preferably 0.01-0.3 torr., with the most preferred range being 0.05-0.25 torr. As for the magnetic gauss level, it can be preferably be at a set point range of 35-150 gauss.

The multilayer structure of the present invention generally includes a silicon wafer. Preferably, the temperature of the silicon wafer during the etching process is important in producing high selectivity of silicon dioxide to silicon nitride. It is also important in the formation of a good profile. It has been determined in the subject process that when higher etch temperatures are employed, the high selectivity previously described herein can be readily maintained. For example, in the case of certain preferred systems such as the MERIE system, a preferable temperature range of the silicon wafer in the multilayer structure during the etching step is about 20–80 degrees C., more preferably about 30–60 degrees C., and most preferably about 35–50 degrees C. This is the temperature of the bottom electrode adjacent to the silicon wafer location during the etching process.

In the process of this invention the high level of selectivity of the $SiO_2$ etch rate with respect to said $Si_3N_4$ etch rate is preferably at least about 10:1, more preferably at least about 20:1, and most preferably at least about 50:1. The process also produces a preferred high $SiO_2$ etch rate which is at least about 2500 angstroms of $SiO_2$ per minute, more preferably at least about 3000 angstroms of $SiO_2$ per minute, and most preferably at least about 4000 angstroms of $SiO_2$ per minute. Furthermore, the selectivity of the $SiO_2$ etch rate with respect to the $Si_3N_4$ etch rate for etching the silicon dioxide outer layer to the silicon nitride stop layer, employing a fluorinated chemical etchant system including an etchant material and an additive material, is preferably at least about 500%, more preferably at least about 1000%, and most preferably at least about 1500%, higher than the selectivity of said $SiO_2$ etch rate with respect to said $Si_3N_4$ etch rate for etching the silicon dioxide outer layer to the silicon nitride stop layer, employing a fluorinated chemical etchant system including the above-described etchant material, but without the subject additive material.

The process of the present invention preferably includes the step of etching the exposed areas of the silicon dioxide outer layer down to the silicon nitride stop layer employing a dry etching process conducted in a magnetically-enhanced etching chamber, more preferably an RIE or an MERIE etching chamber.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
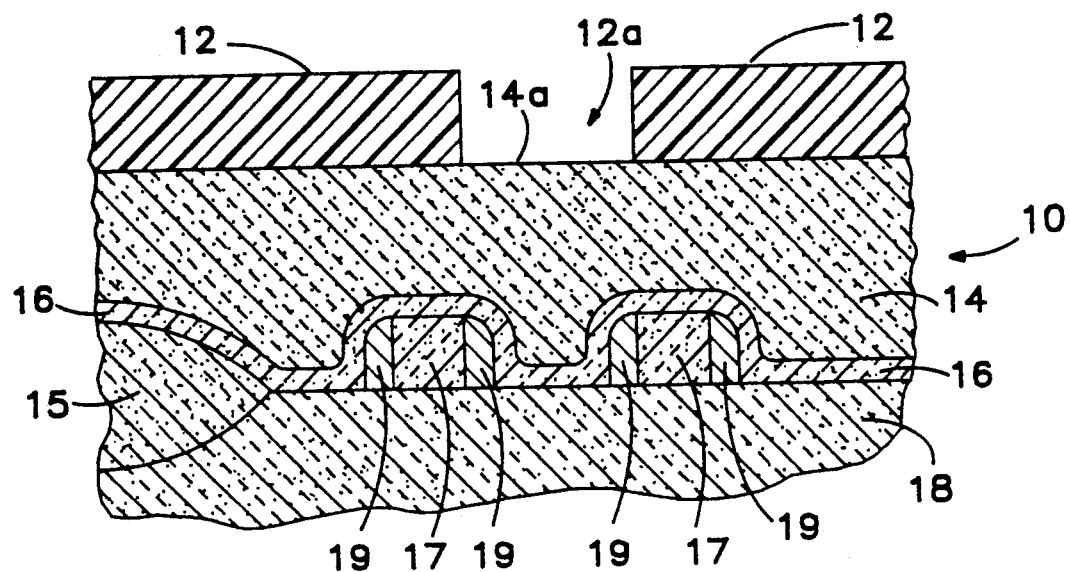
FIG. 1 is a pictorial representation of a multilayer structure of the present invention, such as a semiconductor profile, having a silicon dioxide outer layer on a silicon nitride etch stop layer, prior to etching with the fluorinated chemical etchant system of the present invention.

The inventive process herein is directed towards anisotropically etching a multilayer structure comprising a silicon dioxide outer layer on an underlying silicon nitride stop layer. Referring now to FIG. 1, a schematic representation of a multilayer structure, which is formed by conventional deposition techniques, is depicted. The multilayer structure of FIG. 1, generally designated as "10", is shown prior to conducting the subject etching operations. The multilayer structure 10 comprises a plurality of structural layers which are sequentially deposited onto an underlying silicon structure 18. Multilayer structure 10 comprises a plurality of structural layers including an outer layer 14 having a major outer surface 14a. Structural layer 14 is fabricated of $SiO_2$. Basically, $SiO_2$ (oxide) can be described as being either undoped or doped glass. In the semiconductor industry, the term oxide is generally used instead of glass. Generally an undoped oxide is either a field oxide or gate oxide which is usually grown in a furnace. Doped oxide include BPSG, PSG, etc. which are generally deposited on the silicon wafer with a dopant gas(es) during a deposition process.

The outer structural layer 14 is deposited onto an adjacent intermediate structural layer 16. Layer 16 includes sidewalls and is fabricated of an etch stop layer of silicon nitride. Also shown in FIG. 1 is a chemical etchant protective patterned layer 12 which comprises a photoresist layer having a predetermined arrangement of openings 12a for forming a predetermined pattern in multilayer structure 10. Typically, this is accomplished using a semiconductor photomask and known conventional etch mask patterning techniques. The etch stop layer is deposited onto field oxide 15, silicon substrate 18, and onto a plurality of polysilicon lines 17 having located adjacent their respective sidewalls spacer elements 19.

Figure 2:
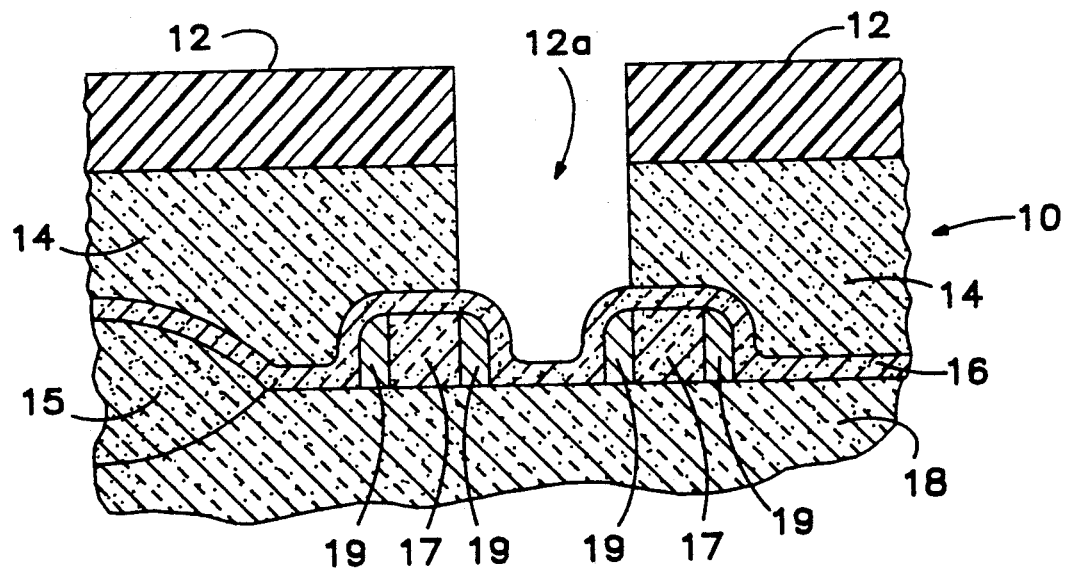
FIG. 2 is a pictorial representation of the multilayer structure of FIG. 1 after etching the silicon dioxide outer layer down to the silicon nitride etch stop layer using the fluorinated chemical etchant system of the present invention.

As seen in FIG. 2, preferred manner of etching of the $SiO_2$ structural $SiO_2$ layer 14 down to etch stop layer 16 is by plasma etch. The gas plasma etch technique employed herein typically has an etching area in a plasma and is generated under vacuum within the confines of an RF discharge unit. The preferred plasma etch technique employed herein may include the use of ECR, Electron Cyclotron Resonance, RIE, MIE, MERIE, PE reactive ion, point plasma etching, magnetically confined helicon and helical resonator, PE, or magnetron PE. In plasma dry etchers, typically the upper electrode is powered while the lower electrode is grounded. In RIE (Reactive Ion Etchers), the lower electrode is powered while the upper electrode is grounded. In triode dry etchers, the upper and lower electrodes can be powered as well as the sidewall. In MERIE (magnetically enhanced reactive ion etch) magnets are used to increase the ion density of the plasma. In ECR (Electron Cyclotron Resonance), the plasma is generated upstream from the main reaction chamber. This produces a low ion energy to reduce damage to the wafer.

A semiconductor device can then located in the desired etcher, within an etching area, and is etched with a fluorinated chemical etchant system to form a predetermined pattern therein. The fluorinated chemical etchant system comprises a chemical etchant composition of the type described above such as $CHF_3$—$CF_4$—Ar, and a $CH_2F_2$ additive material. The fluorinated chemical etchant system is in a substantially gas phase during the etching of the multilayer structure.

The exposed $SiO_2$ layer is selectively etched at a relatively high etch rate down to the $Si_3N_4$ etch stop layer by removing predetermined portions of the $SiO_2$ layer by chemically enhanced ionic bombardment. Some areas of the wafer continue to have $SiO_2$ available to be etched while other areas of the wafer have already reached the nitride layer where the etching process effectively stops because of polymer formation on the nitride surface. In this way, the etching process can provide for the formation of the upright sidewalls in etched layers which have a profile which is substantially vertical.

EXAMPLE 1

A preferred etching system which is employed in the process of this invention is the Applied Materials Precision 5000, a single wafer plasma etching apparatus manufactured by Applied Materials of Santa Clara, Calif. This apparatus comprises a mobile, double cassette platform, a transport chamber with an 8 wafer storage elevator, and from 1–4 plasma etching chambers.

The mobile cassette platform is maintained at atmospheric pressure during the entire operation of the apparatus. It holds two cassettes of wafers, each capable of holding up to 25 wafers. The platform can be raised or lowered and moved laterally so that any particular wafer may be lined up with a narrow door between the platform and the transport chamber.

Nitrogen gas is fed through a flow control valve into the transport chamber to vent the chamber to atmosphere. A robot transfer arm in the transport chamber transfers wafers from the cassette on the mobile cassette platform to the storage elevator in the transport chamber. The transport chamber is connected to a two stage evacuation pump which is used to evacuate the transport chamber and a maintain it at a suitable pressure for transporting wafers from the elevator to the plasma etching chamber. This pressure was maintained at 75–125 mTorr.

The plasma etching chamber is connected to a turbo pump and the two stage pump which evacuates the chamber to a lower pressure than that of the transport chamber. This pressure was typically less than 10 mTorr. When the transport chamber and the plasma etching chamber have reached suitable pressures for wafer transfer, the robot arm transfers a wafer from the wafer storage elevator to the plasma etch chamber.

The plasma etching chamber contains an upper, electrically grounded electrode which also serves as the chamber sidewalls, and a lower, RF powered electrode upon which the wafer is clamped during the plasma etch process, and a set of electromagnetic coils placed around the chamber sidewalls. The chamber also contains a gas distribution plate connected to the lid of the chamber, through which suitable feed gas mixtures are fed into the chamber from a connected gas supply manifold.

When RF energy is applied to the lower electrode, the gas fed into the chamber via the gas distribution plate is converted to plasma. The plasma contains reactive chemical species which etch selected unmasked portions of the wafer clamped to the lower electrode. Electric power is applied to the electromagnetic coils which surround the chamber sidewalls. The magnetic field generated by the coils increases the density of the plasma near the wafer surface. A throttle valve located between the plasma etching chamber regulates the pressure of the chamber to processing values, generally in the range of 10–350 mTorr.

The lower electrode is connected to a wafer cooling system designed to maintain the wafer at a constant temperature during the plasma etch process. This system consists of three parts. The first is an apparatus providing a temperature controlled fluid which circulates through a tunnel in the lower electrode. The second part is an apparatus providing a pressure and flow controlled inert gas (typically helium) of high thermal conductivity which is fed to the underside of wafer during etch via a channel through the lower electrode, opening to grooves on the top face of the lower electrode. The third part of the wafer cooling system is an o-ring seal which lies partially in a circular groove in the lower electrode. The lower electrode is constructed in such a way that it may be raised so that the wafer placed on its top surface is held against a clamp ring supported above the wafer. When the lower electrode is raised to clamp the wafer against the clamp ring, the wafer underside is held tightly against the o-ring seal. This seal prohibits leakage of the inert gas from underneath the wafer to the plasma etch cavity.

The machine is governed by a programmable computer that is programmed to prompt the machine to evacuate and vent the transport chamber and plasma etching chamber, transfer wafers to and from the cassettes, elevator, and etch chamber, control the delivery of process gas, RF power, and magnetic field to the plasma etching chamber, and maintain the temperature of the wafer in the plasma etching chamber, all at appropriate times and in appropriate sequence.

A multilayer structure is then located within the plasma etching chamber and is etched with a fluorinated chemical etchant system to form a predetermined pattern therein. The fluorinated chemical etchant system comprises a chemical etchant composition, such as $CHF_3$, $CF_4$ and Ar, and an additive material as described above. The fluorinated chemical etchant system is in a substantially gas phase during the etching of the multilayer structure.

In the case of the chemical etchant composition including $CHF_3$, $CF_4$ and Ar, and an additive material comprising $CH_2F_2$, the exposed $SiO_2$ layer is selectively etched at a relatively high etch rate and high selectivity down to the $Si_3N_4$ etch stop layer by removing predetermined portions of the $SiO_4$ layer using chemically enhanced ionic bombardment of the gas phase etchant material. Some areas of the wafer continue to have $SiO_2$ available to be etched while other areas of the wafer have already reached the nitride layer where the etch process effectively stops because of polymer formation on the nitride surface. In this way, the etching process can provide for the formation of the upright sidewalls in etched layers which have a profile which is substantially vertical.

Representative etch parameters were employed in the process for etching a multilayer structure of the present invention, as set forth above in this EXAMPLE 1. The flow rates of the component gases, based on the total gas flow of the fluorinated chemical etchant system, used herein was as follows: an etchant material comprised of 16% $CF_4$, 57% Ar, and 9% $CHF_3$, at a total pressure in the system of 200 mTorr, magnetic gases maintained at 150 gauss, and RF power applied at 500 watts.

When 20% of the total gas flow of $CH_2F_2$ was employed as the additive material, a silicon dioxide to-silicon nitride selectivity of more than 30:1, and a silicon dioxide etch rate of over 4,000 angstroms per minute resulted.

EXAMPLE 2

When the process of EXAMPLE 1 was repeated as described above, except that no additive material was introduced along with the etchant material in the feed gas, the selectivity was determined to be about 1.2:1, and the silicon dioxide etch rate was also about 4000 angstroms per minute.

Therefore, when the process of the present invention was employed in EXAMPLE 1, a selectivity of greater than 30:1 was achieved, as compared an selectivity of 1.2:1 for the process of EXAMPLE 2. This is an increase in selectivity of greater than 2400%. In spite of this overwhelming disparity in selectivity, the processes of EXAMPLES 1 and 2 each had a silicon dioxide etch rate of about 4000 angstroms per minute.

For purposes of the subject invention, including the above EXAMPLE 1 and 2, silicon dioxide and silicon nitride wafers were patterned with etch masks having the appropriate etch mask openings and geometries. The wafers were then etched at a specific time to effect an etch into the respective films. The wafers were prepared for analysis using a Scanning Electron Microscope (SEM). The amount of film removed was then evaluated from the SEM photomicrographs obtained at the appropriate mask locations and the etch rates of the respective films were determined. The etch rates were determined by dividing the measured etch depth by the etch times. The selectivity was determined by dividing the silicon oxide etch rate by the silicon nitride etch rate.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A process for plasma etching a multilayer structure to form a predetermined etched pattern therein, comprising:
   providing a multilayer structure, the outer layers of the multilayer structure comprising a silicon dioxide outer layer on an underlying silicon nitride stop layer;
   forming on the top surface of the multilayer structure a chemical etchant resistant layer having a pattern of openings in therein and thereby exposing areas of the silicon dioxide outer layer corresponding to the pattern of openings; and
   etching the exposed areas of the silicon dioxide outer layer to the silicon nitride stop layer, at a high $SiO_2$ etch rate, and at a high level of selectivity of said $SiO_2$ etch rate with respect to said $Si_3N_4$ etch rate, with a fluorinated chemical etchant system including an etchant material ad an additive material, said additive material comprising a fluorocarbon material in which the number of hydrogen atoms is equal to or grater than the number of fluorine atoms, and sad etching step forming an etch pattern in the silicon dioxide outer layer in which the contact sidewalls of said $SiO_2$ outer layer are perpendicular to the multilayer structure layers.

2. The process of claim 1, wherein said additive material comprises $CH_2F_2$.

3. The process of claim 1, wherein said etchant material comprises at least one of $CHF_3$, $CF_4$ and Ar.

4. The process of claim 1, wherein said higher level of selectivity of said $SiO_2$ etch rate with respect to said $Si_3N_4$ etch rate is at least about 10:1.

5. The process of claim 1, wherein said high $SiO_2$ etch rate is at least about 2,500 angstroms of $SiO_2$ per minute.

6. The process of claim 1, wherein said additive material comprises $CH_3F$.

7. The process of claim 1, wherein said etching of the exposed areas of the silicon dioxide outer layer to the silicon nitride stop layer comprises a dry etching process conducted in a magnetically-enhanced etching chamber.

8. The process of claim 1, wherein said fluorinated chemical etchant system comprises from about 70–90% of said etchant material, and from about 10–30% of said additive material, based on the total flow of the fluorinated chemical etchant system.

9. The process of claim 1, wherein the selectivity of said $SiO_2$ etch rate with respect to said $Si_3N_4$ etch rate for etching the silicon dioxide outer layer to the silicon nitride stop layer, employing a fluorinated chemical etchant system including an etchant material and an additive material, is at least about 500% higher than the selectivity of said $SiO_2$ etch rate with respect to said $Si_3N_4$ etch rate for etching the silicon dioxide outer layer to the silicon nitride stop layer, employing a fluorinated chemical etchant system including said etchant material without said additive material.

10. The process of claim 1, wherein said multilayer structure includes a silicon wafer, and the temperature of said silicon wafer during said etching step is from about 20–80 degrees C.

11. A process for using an etchant material for plasma etching a multilayer structure to form a etched pattern therein, comprising:
    providing a fluorinated chemical etchant system including an etchant material and an additive material, said additive material comprising at least one of $CH_2F_2$ or $CH_3F$;
    providing a multilayer structure having a plurality of structural layers, one of the outer structural layers of the multilayer structure comprising a silicon dioxide outer layer on an underlying silicon nitride stop layer;
    forming on the top surface of the multilayer structure a chemical etchant resistant layer having a pattern of openings therein and thereby exposing areas of the silicon dioxide outer layer corresponding to the pattern of openings; and
    etching the exposed areas of the silicon dioxide outer layer to the silicon nitride stop layer, at a high $SiO_2$ etch rate, and at a high level of selectivity of said $SiO_2$ etch rate with respect to said $Si_3N_4$ etch rate, with a fluorinated chemical etchant system including an etchant material and an additive material, said additive material comprising a fluorocarbon material in which the number of hydrogen atoms is equal to or greater than the number of fluorine atoms, ad said etching step forming an etch pattern in the silicon dioxide outer layer in which the contact sidewalls of sad $SiO_2$ outer layer are perpendicular to the multilayer structure layers.

12. The process of claim 11, wherein said etchant material comprising at least one of $CHF_3$, $CF_4$ and Ar.

13. The process of claim 11, wherein said high level of selectivity of said $SiO_2$ etch rate with respect to said $Si_3N_4$ etch rate is at least about 10:1.

14. The process of claim 11, wherein said high $SiO_2$ etch rate is at least about 2,500 angstroms of $SiO_2$ per minute.

15. The process of claim 11, wherein said additive material comprises $CH_3F$.

16. The process of claim 11, wherein said etching of the exposed areas of the silicon dioxide outer layer to the silicon nitride stop layer comprises a dry etching process conducted in a magnetically-enhanced etching chamber.

17. The process of claim 11, wherein said fluorinated chemical etchant system comprises from bout 70–90% of said etchant material, and from about 10–30% of said additive material, based on the total flow of the fluorinated chemical etchant system.

18. The process of claim 11, wherein the selectivity of said $SiO_2$ etch rate with respect to said $Si_3N_4$ etch rate for etching the silicon dioxide outer layer to the silicon nitride stop layer, employing a fluorinated chemical etchant system including an etchant material and an additive material, is at least about 500% higher than the selectivity of said $SiO_2$ etch rate with respect to said $Si_3N_4$ etch rate for etching the silicon dioxide outer layer to the silicon nitride stop layer, employing a fluorinated chemical etchant system including said etchant material without sad additive material.

19. The process of claim 11, wherein said multilayer structure includes a silicon wafer, and the temperature of said silicon wafer during said etching step is from about 20–80 degrees C.

20. A fluorinated chemical etchant system for plasma etching a multilayer structure having a plurality of structural layers comprising a silicon dioxide outer layer on an underlaying silicon nitride layer, the multilayer structure having a chemical etchant resistant patterned layer including a pattern of openings therein, thereby exposing a plurality of areas of the top surface of the multilayer structure corresponding to the pattern of openings during etching, which comprises:

a fluorinated chemical etchant system including an etchant material and an additive material, said additive material comprising a fluorocarbon material in which the number of hydrogen atoms is equal to or greater than the number of fluorine atoms, for etching the plurality of exposed areas of the silicon dioxide outer layer to the silicon nitride stop layer, at a high $SiO_2$ etch rate, and at a high level of selectivity of said $SiO_2$ etch rate, respect to said $Si_3N_4$ etch rate, to form an etched pattern in the silicon dioxide layer in which the contact sidewalls of said $SiO_2$ outer layer are perpendicular to the multiplayer structure layers.

21. The system of claim 20, wherein said additive material comprises $CH_2F_2$.

22. The system of claim 20, wherein said etchant material comprising at least one of $CHF_3$, $CF_4$ and Ar.

23. The system of claim 20, wherein said high level of selectivity of said $SiO_2$ etch rate with respect to said $Si_3N_4$ etch rate is at least about 10:1.

24. The system of claim 20, wherein said high $SiO_2$ etch rate is at least about 2,500 angstroms of $SiO_2$ per minute.

25. The process of claim 20, wherein said fluorinated chemical etchant system comprises from about 70–90% of said etchant material, and from about 10–30% of said additive material, based on the total flow of the fluorinated chemical etchant system.

26. The system of claim 20, wherein the selectivity of said $SiO_2$ etch rate with respect to said $Si_3N_4$ etch rate for etching the silicon dioxide outer layer to the silicon nitride stop layer, employing a fluorinated chemical etchant system including an etchant material and an additive material, is at least about 500% higher than the selectivity of said $SiO_2$ etch rate with respect to said $Si_3N_4$ etch rate for etching the $SiO_2$ outer layer to the $Si_3N_4$ stop layer, employing a fluorinated chemical etchant system including said etchant material without said additive material.

27. A dry etching process for a multilayer semiconductor wafer, comprising:
   a) providing a silicon-dioxide layer;
   b) providing a silicon-nitride layer, located under the silicon-dioxide layer; and
   c) using a plasma,
      having an etchant, and a fluorocarbon additive gas in which the number of hydrogen atoms are greater than the number of fluorine atoms,
      to etch through the silicon-dioxide layer down to the top surface of the silicon-nitride layer.

28. An etching process as in claim 22, further comprising:
etching with the plasma when the bottom electrode is within a temperature range from 20 to 80 degrees C.

29. An etching process as in claim 27, wherein the silicon-dioxide layer etch rate is at least about 2,500 angstroms per minute.

30. An etching process as in claim 27, wherein the plasma etching is dry etching process conducted in a magnetically-enhanced etching chamber.

31. An etching process as in claim 27, wherein the plasma etching has a selectivity of $SiO_2$ etch rate with respect to $Si_3N_4$ etch rate is at least a 15 to 1 ratio.

* * * * *